United States Patent
Kelkar

(12)
(10) Patent No.: US 6,291,367 B1
(45) Date of Patent: Sep. 18, 2001

(54) METHOD FOR DEPOSITING A SELECTED THICKNESS OF AN INTERLEVEL DIELECTRIC MATERIAL TO ACHIEVE OPTIMUM GLOBAL PLANARITY ON A SEMICONDUCTOR WAFER

(75) Inventor: Amit S. Kelkar, Castle Rock, CO (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 09/586,660

(22) Filed: Jun. 1, 2000

(51) Int. Cl.[7] .......................... H01L 21/31; H01L 21/469
(52) U.S. Cl. .................... 438/778; 438/626; 438/692; 438/787; 438/788; 438/791; 438/792; 427/579; 427/255.37
(58) Field of Search ................. 438/14–18, 624, 438/626, 631, 633, 692, 694, 697, 778, 787, 788, 791, 792; 427/255.23, 255.37, 563, 578, 579

(56) References Cited

U.S. PATENT DOCUMENTS

| | | | |
|---|---|---|---|
| 4,952,274 | 8/1990 | Abraham | 156/643 |
| 5,716,872 | 2/1998 | Isobe | 437/195 |
| 5,872,058 | 2/1999 | Van Cleemput et al. | 438/692 |
| 5,872,401 | 2/1999 | Huff et al. | 257/758 |
| 5,880,519 | * 3/1999 | Bothra et al. | 257/641 |
| 5,968,610 | 10/1999 | Liu et al. | 427/579 |
| 6,008,116 | 12/1999 | Tran | 438/623 |
| 6,030,881 | * 2/2000 | Papasouliotis et al. | 438/424 |

* cited by examiner

Primary Examiner—Matthew Smith
Assistant Examiner—Craig P. Lytle
(74) Attorney, Agent, or Firm—Thomas Schneck; John P. McGuire, Jr.

(57) ABSTRACT

A method of depositing an interlevel dielectric material on a semiconductor wafer at a selected thickness such that the best global planarity of the dielectric layer is achieved. A model for the deposition of a silicon dioxide layer is developed based upon the physics of deposition and sputtering and based upon the minimum geometry of features in the semiconductor device. First the geometric parameters of the metal features are determined. Then, based upon the most aggressive aspect ratio between metal lines, the deposition rate to sputter rate ratio is calculated. The film thickness for optimum global planarity is determined based on the calculated ratio. The dielectric material is then deposited on the metal features using HDP-CVD techniques in a manner using the calculated ratio to stop deposition at the determined film thickness such that the optimum thickness for global planarity is achieved.

20 Claims, 4 Drawing Sheets

METHOD FOR DEPOSITING A SELECTED THICKNESS OF AN INTERLEVEL DIELECTRIC MATERIAL TO ACHIEVE OPTIMUM GLOBAL PLANARITY ON A SEMICONDUCTOR WAFER

DESCRIPTION

1. Technical Field

The present invention relates generally to the field of silicon processing, and more specifically to a method of forming an interlevel dielectric on a semiconductor wafer.

2. Background Art

In the construction of a semiconductor device, many conductive device regions or layers are formed on a semiconductor substrate. In order to isolate these layers or regions, an interlevel dielectric layer is formed over these regions. Usually, a chemical vapor deposition (CVD) technique is used to deposit the inter-level dielectric layer over the conductive regions. In a chemical vapor deposition process, chemicals containing the atoms or molecules required in the final film are mixed and reacted in a deposition chamber to form a vapor. The atoms or molecules deposit on the wafer surface and build up to form a film. Common CVD methods include atmosphere-pressure CVD (APCVD), low-pressure CVD (LPCVD) and plasma-enhanced CVD (PECVD). The PECVD method provides an advantage over the APCVD and LPCVD methods in that it can be carried out at lower substrate temperatures. This is because the PECVD uses an rf-induced glow discharge or plasma to transfer energy into the reactant gases, rather than relying solely on thermal energy to initiate and sustain chemical reactions. This allows PECVD to be used to deposit films on substrates that do not have the thermal stability to accept coating by other methods, such as, for example, the formation of silicon nitride and silicon oxide over metals.

As advances are made in semiconductor technology, circuit elements and interconnections on wafers or silicon substrates are becoming more and more dense. As the circuit densities continue to increase, the widths of insulator-filled gaps or trenches, provided to physically and electrically isolate circuit elements and conductive lines, decrease. This increases the gap aspect ratio, which is usually defined as the gap height divided by the gap width. It is more difficult to fill these gaps with higher aspect ratios using the above CVD techniques, which can lead to unwanted voids and discontinuities in the insulating or gap-fill material.

Presently, high density plasma chemical vapor deposition (HDP-CVD) techniques are used to fill gaps having higher aspect ratios. HDP-CVD allows for the addition of a sputter component to the plasma deposition process which can be controlled to assist in gap-filling during deposition processes in a manner superior to the other CVD methods noted above. Typical HDP deposition processes employ chemical vapor deposition with a gas mixture containing oxygen, silane, and inert gases, such as argon, to achieve simultaneous dielectric etching and deposition. In an HDP process, an RF bias is applied to a wafer substrate in a reaction chamber. Some of these gas molecules, particularly argon, are ionized in the plasma and accelerate toward the wafer surface when the RF bias is applied to the substrate. Material is thereby sputtered when the ions strike the surface. This results in the dielectric material deposited on the wafer surface being simultaneously sputter etched. This helps to keep gaps open during the deposition process, which allows gaps with higher aspect ratios to be filled.

The conductive elements and interconnections, over which the interlevel dielectric is to be deposited, typically comprises a plurality of metal features, some of which have different sizes. A typical conductive pattern comprises a dense array of metal features, typically separated by gaps having a width of less than about one micron. However, a metal feature next to one of the metal features of the dense array, may be considerably larger than the metal features of the dense array. In the case where an adjacent feature has an upper surface area of a size greater than the upper surface area of the metal features of the dense array, then when a gap-filling dielectric layer is deposited, a step is formed with increasing height between the relatively smaller metal feature of the dense array and the relatively larger metal feature. With reference to FIG. 1, the metal features 15 and 17 of a dense array 12 have an upper surface area that is smaller than the upper surface area of a much larger metal feature 19 that is located next to the dense array 12. When a dielectric layer 21 is deposited over the metal features 15, 17, 19, a step 27 is formed between the thickness 23 of dielectric material required to cover the smaller features 15, 17 and the thickness of dielectric material 25 required to cover the feature with the larger upper surface area. This step 27 makes it extremely difficult to planarize the dielectric layer that was deposited on the metal features. What is needed is a way to deposit a dielectric layer that minimizes the step height and improves the overall planarity of the layer across the semiconductor wafer.

It is the object of the present invention to provide a method of depositing an interlevel dielectric material on a semiconductor wafer that minimizes the amount of step height between metal features.

It is a further object of the present invention to provide a method of depositing an interlevel dielectric material on a semiconductor wafer based on a theoretical prediction of the high density plasma chemical vapor deposition thickness of the dielectric material that provides the best global planarity across the wafer and across each die.

SUMMARY OF THE INVENTION

The above objects have been achieved by a method of depositing an interlevel dielectric material on a semiconductor wafer at a selected thickness such that the best global planarity of the dielectric layer is achieved. A model for the deposition of a silicon dioxide dielectric layer is developed based upon the physics of deposition and sputtering, and based upon the minimum geometry of metal features in the semiconductor device. The HDP deposition model developed in this invention is then used to predict the optimum thickness of deposited film that, after a conformal cap deposition and chemical mechanical polishing (CMP) planarization, provides the best global planarity across the wafer. First, the geometric parameters of the metal features, such as the minimum width, pitch and height, are determined. Then, based upon the most aggressive aspect ratio between metal lines, the chemical vapor deposition rate to sputter rate ratio (D/S) is calculated. The optimum film thickness of the deposited oxide is determined based on the minimum width and space of the metal features, the height of the features, the deposition rate to sputter rate ratio, the angle of maximum sputter yield and the level of planarity required by the process. The dielectric material is then deposited on the metal features using HDP-CVD techniques in a manner using the calculated ratio to stop the deposition at the determined film thickness such that the optimum thickness for global planarity is achieved.

BEST MODE OF CARRYING OUT THE INVENTION

Figure 1:
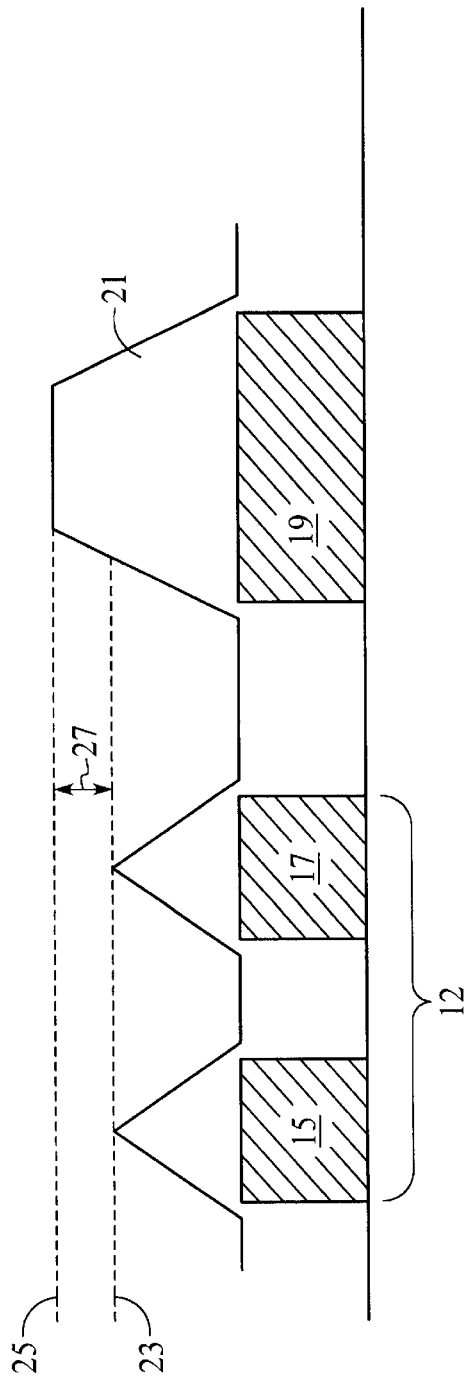
FIG. 1 is a cross-sectional view of the HDP-CVD deposition of a dielectric material on a plurality of metal traces as known in the prior art.
Figure 2:
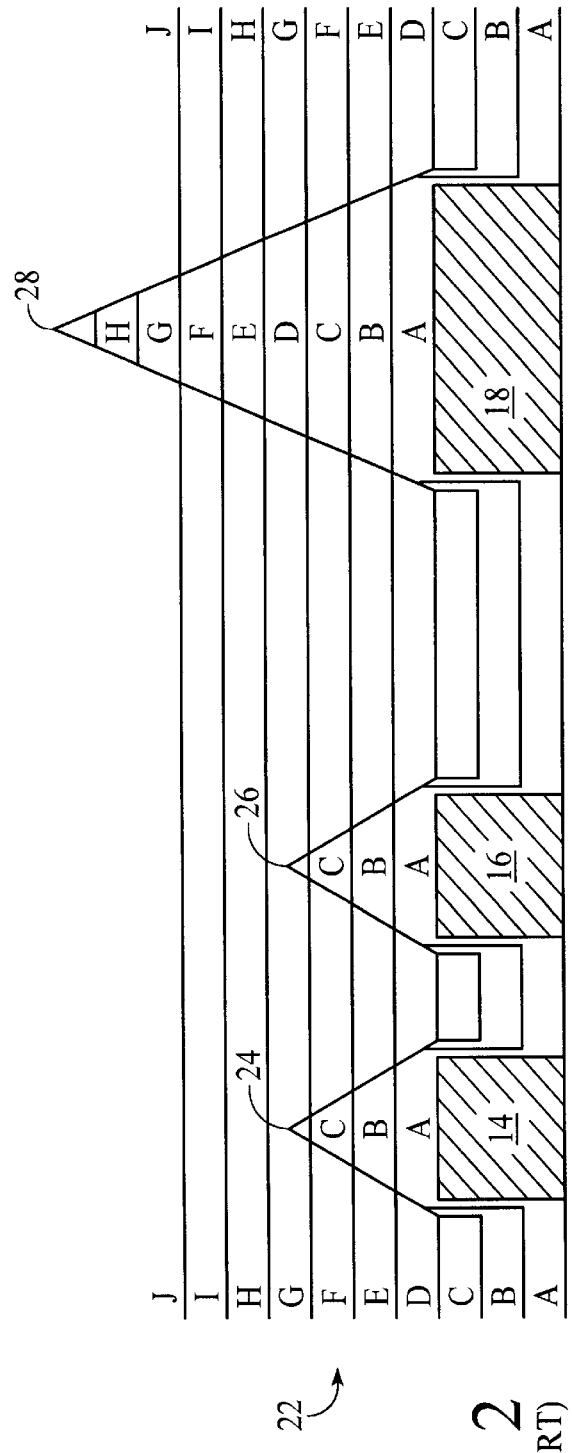
FIG. 2 is a cross-sectional view of the HDP-CVD deposition of several layers of a dielectric material on a plurality of metal traces as known in the prior art.

With reference to FIG. 2, in a typical HDP-CVD deposition process, as known in the prior art, the various layers of a dielectric material, such as silicon dioxide, or quartz ($SiO_2$), are deposited over the metal traces. FIG. 2 shows the dielectric material 22 being divided into ten layers A–J, layer A being the first layer deposited over the metal traces 14, 16, 18, and layer J being the final layer deposited. As shown, the layers A–J of the dielectric material 22 accumulate on top of the metal traces 14, 16, 18 in the form of a triangular structure. This is because, although the argon gas molecules are sputtered uniformly across the surface, the sputtering rate is faster at the corners of the metal traces due to the angle of incidence of the sputtering gas at the corners.

Figure 3:
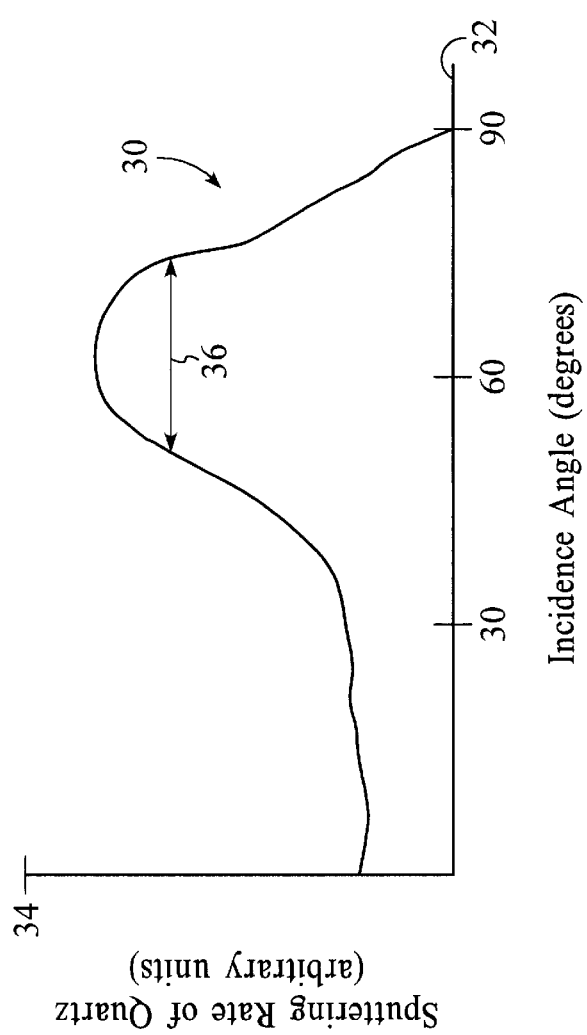
FIG. 3 is a graph showing a typical relationship between the incidence angle of the sputtering gas (Ar) and the sputtering rate of the target material (quartz).

With reference to FIG. 3, there is an incidence angle of the sputtering gas relative to the sputtering surface that provides the maximum sputtering rate yield. That maximum sputtering angle can vary and is determined by the particular HDP-CVD equipment that is employed. In most systems, the incidence angle that produces the maximum sputtering yield ranges from 45 degrees to 60 degrees. Because the angle of incidence at the corners of the metal traces is at or near the angle of maximum yield, the sputtering rate at the corners of the metal traces is faster than the sputtering rate on top of the metal traces. This causes the substrate material to form in the shape of a triangular structure, as shown in FIG. 2. In the graph 30 of FIG. 3, the incidence angle 32 of the sputtering gas is plotted against the sputtering rate 34 of the deposited surface material. In the preferred embodiment of the invention, as shown in FIG. 3, the angle of maximum sputtering yield is 60 degrees. The range of sputtering 36 for maximum sputtering yield is shown to be between 45 degrees and 70 degrees. Therefore, a maximum sputtering yield angle of 60 degrees is used in the calculations of optimum film thickness used in the preferred embodiment of the present invention.

Referring back to FIG. 2, metal trace 14 is covered by triangular dielectric structure 24 consisting of three layers A, B and C. Similarly, metal trace 16 is covered by a triangular dielectric structure 26 consisting of layers A, B and C. Metal trace 18 has a wider upper surface so therefore the size of the completed triangular dielectric structure 28 over metal trace 18 is much larger and consists of layers A–H. Each dielectric layer A–J of the dielectric material 22 fills in the gaps between the metal traces and also deposits on top of the metal traces 14, 16, 18 in such a way as to form the triangular structures 24, 26 and 28. As can be seen in FIG. 2, the metal trace 18 having the wider surface area requires more dielectric layers in order to completely cover the metal trace with the triangular structure 28. For example, when layer D is applied, the triangular structures 24 and 26 have already been formed over metal traces 14 and 16 and the dielectric material of layer D just fills in around and between the metal traces 14 and 16. However, the layer D continues to pile on top of metal trace 18 to form the triangular structure 28. As can be seen, as additional layers of dielectric material are applied, a large height differential, or step height, is created between the tops of triangular structure 24 and 26 and the top of triangular structure 28.

Figure 5:
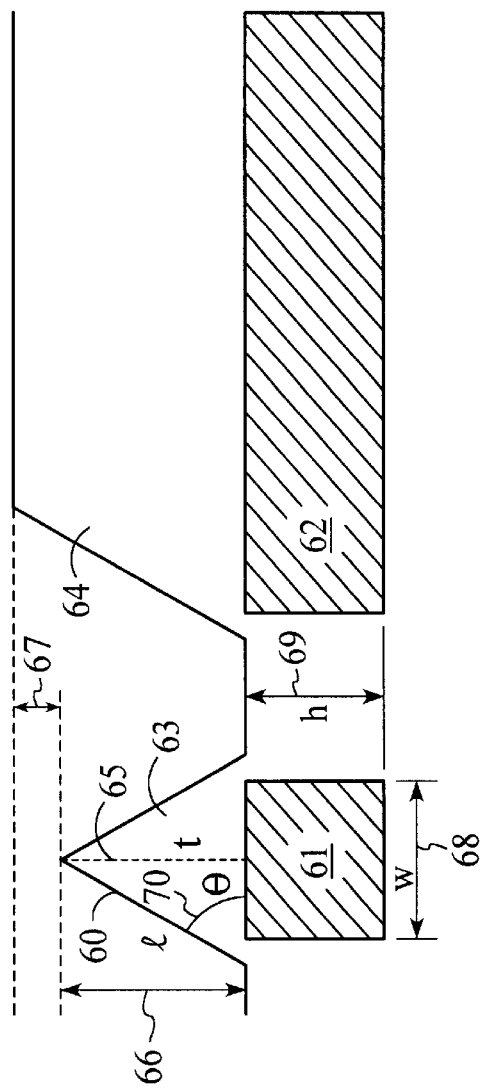
FIG. 5 is a cross-sectional view of metal traces having a dielectric layer deposited thereon and showing the various dimensions of the parameters used in the present invention.

With reference to FIG. 5, the first step in the method of the present invention is to determine the set of geometric parameters of a series of metal features on the semiconductor wafer surface. Each metal trace 61 has a width (w) 68 and a height (h) 69. The triangular structure 63, which is the dielectric material directly on top of the metal trace 61, has a thickness (t) 65 and an angle of sputtering yield (Θ) 70.

Figure 4:
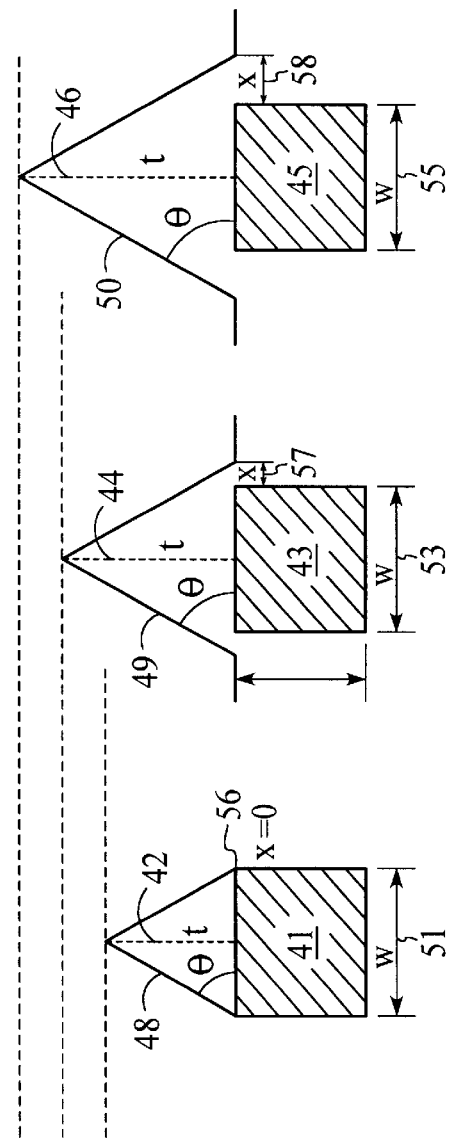
FIG. 4 is a cross-sectional view of metal traces, each having a dielectric material deposited thereon at different deposition rate to sputter rate ratios.

Referring to FIG. 4, an additional geometric parameter that is relevant in determining the deposition rate to sputter rate is the amount of corner growth (x) 56, 57, 58 of the substrate on the top corner of the trace. The deposition rate to sputter rate ratio at which there is zero corner growth will vary depending on the parameters of the particular HDP-CVD apparatus employed. Once these parameters have been determined, the next step is to calculate a ratio between the deposition rate and the sputtering rate based on the set of geometric parameters. In FIG. 4, trace 41 is covered by a triangular structure 48 having a thickness (t) 42 and an angle Θ. The deposition rate to sputtering rate ratio of the insulating material that forms structure 48 on trace 41 is the deposition rate to sputter rate ratio at which there is zero corner growth. The corner growth rate 56 is equal to zero since the sides of the triangular structure 48 are aligned directly with the upper corner of the metal trace 41. In the preferred embodiment of the invention, the deposition rate to sputter rate ratio at which zero corner growth is obtained is equal to 3.2. In comparison, the triangular structure 49 formed by substrate material deposited on trace 43 is deposited at a higher deposition rate to sputter rate ratio such as, for example, a ratio of 4.5. At a deposition rate to sputter rate ratio of 4.5, the sides of the triangular structure 49 spread outward from the metal trace 43 such that there is a corner growth distance (x) 57. Because of the corner growth distance (x) 57, the thickness 44 of the dielectric layer required to form the triangular structure 49 is greater than the thickness 42 of the dielectric layer required to form the triangular structure 48 on trace 41. Additionally, as shown in FIG. 4, the triangular structure 50 formed by the dielectric layer deposited on trace 45 is deposited at an even higher deposition rate to sputter rate ratio, such as 7.5. With the higher deposition rate to sputter rate ratio of 7.5, the triangular structure 50 covering the metal trace 45 has an even larger corner growth (x) 58 and a greater thickness 46 than the other metal traces 41 and 43 which have lower deposition rate to sputter rate ratios. Therefore, it can be seen that in order to get the lowest possible peak on the triangular structures of dielectric material formed over the metal traces, it is preferable to choose a deposition rate to sputter rate ratio wherein the corner growth (x) is minimized.

However, the deposition rate to sputter rate ratio should not be too low. If the deposition rate to sputter rate ratio is lower than the ratio at which there is zero corner growth, then the triangular structure does not cover the entire upper surface of the metal trace 41 and the corners of the upper surface of the metal trace 41 will be sputtered away, which is not desirable.

In order to determine the film thickness (t) at which the triangular structure is complete, the geometrical relation between the height and width of the triangular structure for the metal trace having the smallest width 61 is used. With reference to FIG. 5, the triangular structure 63 covering the smallest metal trace 61, has a height or thickness (t) 65 and a base equal to the width (w) 68 plus two times the corner growth (x) 76. The triangular structure also has two sides, each having a length (t) 60. In the preferred embodiment of the invention, wherein the angle of incidence Θ is equal to 60 degrees, all of the sides of the triangle have the same length so that l=2x+w. Using trigonomic relationships, sin $$\Theta = \frac{t}{l},$$

which can be rewritten, t=sin Θ (w+2x). Therefore, in the preferred embodiment of the invention, the film thickness is equal to a value defined by the width of the metal trace plus two times the corner growth (the distance x on each side of the metal trace), multiplied by the sine of the angle Θ which produces the maximum sputtering yield. In the general case, in which the angle Θ is not equal to 60 degrees, the relationship tan Θ=t/(½w+x) exists, so that t=tan Θ (½w+x). Therefore, the film thickness is equal to a value defined by one half of the width of the metal trace plus two times the corner growth thickness multiplied by the tangent of the angle Θ which produces the maximum sputtering yield.

The deposition rate to sputter rate ratio (D/S) is known in the art as being the effective thickness deposited plus the sputter rate (SR), divided by the sputter rate, or $$D/S = \frac{\mathit{eff} \cdot t + SR}{SR},$$

which can be rewritten as $$D/S = \frac{\mathit{eff} \cdot t}{SR} + 1$$

To determine the amount of corner growth (x), two scenarios need to be considered. In the first case, the deposition rate to sputter rate ratio is equal to the ratio at which there is zero corner growth, $D/S_0$. In the second case, the deposition rate to sputter rate ratio is equal to the ratio at which the film thickness is to be determined, D/S. The deposition thickness is assumed to be equal to the height of the metal feature, h. Using the equation for DIS noted above results in, for the first case:

$$D/S_0 = \frac{h}{SR_1} + 1,$$

and for the second case:

$$D/S = \frac{h}{SR_2} + 1.$$

These equations can be rearranged to produce the following equations for the sputter rates, $$SR_1 = \frac{h}{(D/S_0 - 1)} \quad \text{and} \quad SR_2 = \frac{h}{(D/S - 1)}$$

The difference between the two sputtering rates ($SR_1 - SR_2$) is equivalent to the thickness of the corner growth, x. Therefore, the corner growth (x) can be defined as the height of the metal trace, h, multiplied by the difference between one divided by the deposition rate to sputter rate ratio at which there is zero corner growth minus one and one divided by the deposition rate to sputter rate ratio at which the optimum thickness is to be determined minus one, or $$x = h \left[ \frac{1}{(D/S_0 - 1)} - \frac{1}{(D/S - 1)} \right]$$

The equation for corner growth relates the deposition rate to sputter rate ratio to the optimum thickness of the layers of dielectric material. The optimum film thickness may be greater than or less than the height of the metal feature, depending on the width of the feature, w.

Referring to FIG. 5, two other values to be defined are the local step height 66 and the global step height 67. The local step height 66 is the height between the top of the triangular structure covering the trace and the height of the dielectric material located outside the triangular structure. At the point where the local step height is the greatest, the triangular structure formed on top of the trace is at a maximum and the dielectric material located outside of the triangular structure on the trace is at a minimum. As more dielectric layers are added to the traces, the local step height gets smaller as the dielectric material outside of the triangular structure of the trace gets larger. The global step height 67 is the difference between the top of the triangular structure 63 covering the smallest trace 61 and the top of the triangular structure 64 covering the largest trace 62. The global step height 67 is smallest when the triangular structure 63 of the smaller trace 61 reaches its peak. As more dielectric layers are added and the triangular structure 64 of the larger trace 62 gets larger, the global step height 67 increases.

Figure 6A:
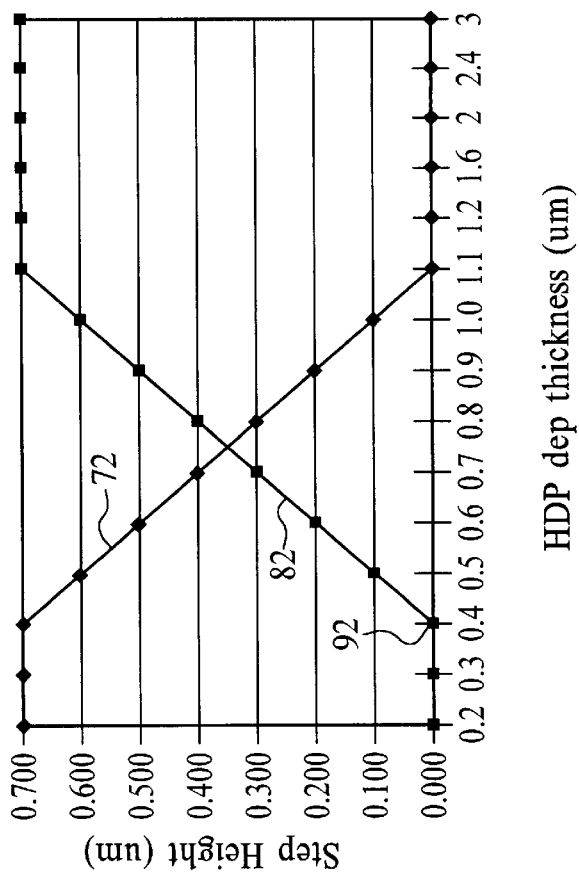
FIGS. 6A and 6B are graphs showing the relationship of step height versus HDP deposition thickness for different deposition rate to sputter rate ratios.
Figure 6B:
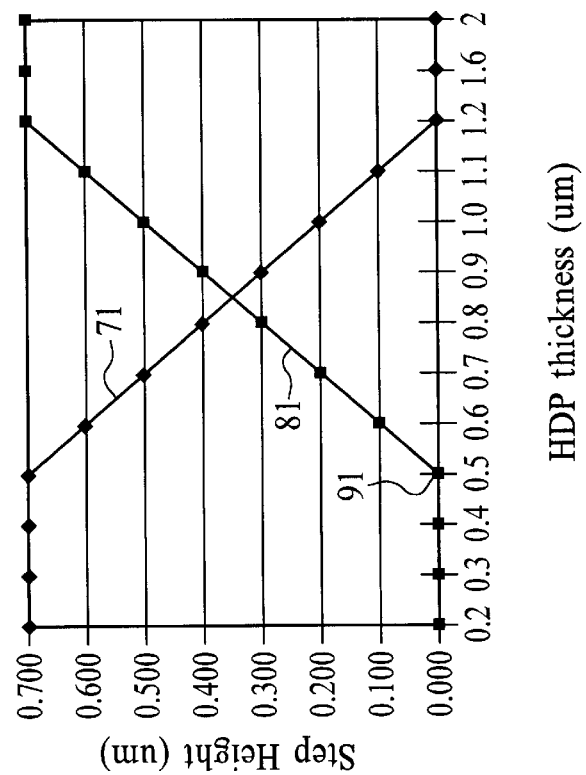

With reference to FIGS. 6A and 6B, the step height is plotted versus the HDP deposition thickness of the triangular structures. In FIG. 6A, the deposition rate to sputtering rate ratio is 4. Graph 71 represents the local step height and graph 81 represents the global step height. As can be seen, as the thickness of the dielectric material increases, the local step height 71 decreases, while the global step height 81 increases. The point at which the global step height 81 starts to increase and the local step height begins to decrease is the point 91 of optimum thickness. In FIG. 6A the HTP optimum thickness 91 is determined to be 0.5 μm. FIG. 6B is the same graph except with a lower deposition rate to sputtering rate of 3.5. In this case, the point where the local step height 72 begins to decrease and the global step height 82 begins to increase produces an optimum thickness point 92 of 0.4 μm. Therefore, it is clear that having a lower deposition rate to sputter rate ratio, without going so low as to sputter the metal trace, produces a minimum optimum thickness of the dielectric layer.

Figure 7:
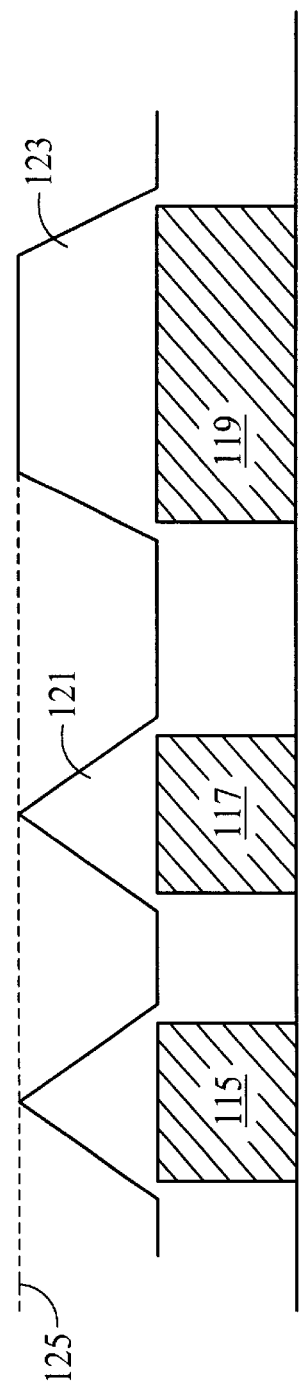
FIG. 7 is a cross-sectional view of the HDP-CVD deposition of a dielectric material on a plurality of metal traces using the method of the present invention.

With reference to FIG. 7, once an optimum film thickness has been determined based on the formulas described above, the process parameters that are necessary to achieve the optimum film thickness, such as the gas flow rate, deposition rate, the amount of time needed to deposition and sputter, plasma power, etc. are entered into the machine that carries out the HDP-CVD process. The HDP-CVD machine then applies the dielectric layer over the traces in a manner as known in the art using the parameters that were calculated to achieve the optimum thickness of the dielectric layer. Optical measurement tools are used to measure the film thickness. Ideally, it is preferred that the thickness of the dielectric layer deposited be equal to the determined film thickness. Alternatively, the determined film thickness can be just used as a guideline with allowable tolerances, for example plus or minus twenty percent.

As shown in FIG. 7, when the optimum film thickness of the dielectric layer is achieved, there is little or no step height 125 between the height of the dielectric layer 121 over the metal traces 115 and 117 and the height of the dielectric layer 123 over the larger trace 119. By minimizing the step height, it helps to make it easier to planarize the semiconductor wafer. After the deposition of the insulating layer, a conformal oxide cap is deposited on top of the dielectric layer and then a chemical mechanical polishing step is implemented to planarize the wafer. By applying the dielectric material in a manner as described in the present invention, step heights are reduced, which makes the subsequent CMP steps easier to carry out, and additionally provides better planarization of the oxide over the metal traces.

What is claimed is:

1. A method for depositing a selected thickness of a dielectric material comprising:
    determining a set of geometric parameters of a series of metal features on a semiconductor wafer surface,
    calculating a ratio between a chemical vapor deposition rate and a sputter rate based on the set of geometric parameters for said wafer,
    determining a film thickness based on the calculated ratio, and
    depositing the dielectric material on the metal features in a manner using the calculated ratio to stop deposition whereby an optimum thickness for global planarity is achieved.

2. The method of claim 1, wherein the set of geometric parameters includes a minimum width, a minimum pitch and a minimum height of the series of metal features.

3. The method of claim 1, wherein the set of geometric parameters includes a corner thickness of the dielectric material at a top corner of one of the metal features.

4. The method of claim 3, wherein the corner thickness has a relationship to a minimum height of the metal features multiplied by the difference between one divided by the ratio of deposition rate to sputter rate at zero corner growth minus one and one divided by the ratio of deposition rate to sputter rate at a deposited thickness minus one.

5. The method of claim 4, wherein the determined film thickness has a relationship to a sine of an angle of maximum sputter yield multiplied by a value of twice the corner thickness plus the minimum width.

6. The method of claim 4, wherein the determined film thickness has a relationship to a tangent of an angle of maximum sputter yield multiplied by a value of one half of the minimum width plus the corner thickness.

7. The method of claim 1, wherein the dielectric material is deposited over the metal features at a thickness equal to the determined film thickness.

8. The method of claim 1, wherein the dielectric material is deposited over the metal features at a thickness that is within twenty percent of the determined film thickness.

9. The method of claim 1, further including the steps of:
    depositing a conformal cap oxide, and
    employing a chemical mechanical polishing technique to planarize the semiconductor wafer surface.

10. The method of claim 1, wherein the step of depositing the dielectric material on the metal features is carried out using a HDP-CVD process.

11. A method for depositing a selected thickness of a dielectric material comprising:
    determining a set of geometric parameters of a series of metal features on a semiconductor wafer surface, the set of geometric parameters including a minimum width, a minimum pitch, a minimum height, and a corner thickness of the dielectric material at a top corner of the metal features,
    calculating a ratio between a chemical vapor deposition rate and a sputter rate based on the set of geometric parameters,
    determining a film thickness based on the calculated ratio, and
    depositing the dielectric material on the metal features in a manner using the calculated ratio to stop deposition, whereby an optimum thickness for global planarity is achieved.

12. The method of claim 11, wherein the corner thickness has a relationship to the minimum height of the metal features multiplied by the difference between one divided by the ratio of deposition rate to sputter rate at zero corner growth minus one and one divided by the ratio of deposition rate to sputter rate at a deposited thickness minus one.

13. The method of claim 11, wherein the determined film thickness has a relationship to a sine of an angle of maximum sputter yield multiplied by a value of twice the corner thickness plus the minimum width.

14. The method of claim 11, wherein the determined film thickness has a relationship to a tangent of an angle of maximum sputter yield multiplied by a value of one half of the minimum width plus the corner thickness.

15. The method of claim 11, wherein the dielectric material is deposited over the metal features at a thickness equal to the determined film thickness.

16. The method of claim 11, wherein the dielectric material is deposited over the metal features at a thickness that is within twenty percent of the determined film thickness.

17. The method of claim 11, wherein the step of depositing the dielectric material on the metal features is carried out using a HDP-CVD process.

18. A method for depositing a selected thickness of a dielectric material comprising:
    determining a set of geometric parameters of a series of metal features, the set of geometric parameters including a minimum width, a minimum pitch, a minimum height, and a corner thickness of the dielectric material at a top corner of the metal features,
    calculating a ratio between a chemical vapor deposition rate and a sputter rate based on the set of physical parameters,
    determining a film thickness wherein the corner thickness has a relationship to the minimum height of the metal features multiplied by the difference between one divided by the ratio of deposition rate to sputter rate at zero corner growth minus one and one divided by the ratio of deposition rate to sputter rate at the optimum thickness minus one, and wherein the film thickness is related to a tangent of an angle of maximum sputter yield multiplied by a value of one half the minimum width plus the corner thickness, and entering the calculated ratio and the set of geometric parameters into a HDP-CVD apparatus for depositing the dielectric material, depositing the dielectric material on the metal features using a HDP-CVD process in a manner using the calculated ratio to stop deposition, whereby an optimum thickness for global planarity is achieved.

19. The method of claim 18, wherein the dielectric material is deposited over the metal features at a thickness equal to the determined film thickness.

20. The method of claim 18, wherein the dielectric material is deposited over the metal features at a thickness that is within twenty percent of the determined film thickness.

* * * * *